(12) United States Patent
Kirchner et al.

(10) Patent No.: US 9,793,890 B2
(45) Date of Patent: Oct. 17, 2017

(54) SYSTEM AND METHOD FOR A SWITCH TRANSISTOR DRIVER

(71) Applicant: Infineon Technologies Austria AG, Villach (AT)

(72) Inventors: Uwe Kirchner, Feldkirchen (AT); Harald Christian Koffler, Villach (AT); Karl Norling, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/706,593

(22) Filed: May 7, 2015

(65) Prior Publication Data

US 2016/0329883 A1    Nov. 10, 2016

(51) Int. Cl.
*H03K 17/16* (2006.01)

(52) U.S. Cl.
CPC ......... *H03K 17/168* (2013.01); *H03K 17/167* (2013.01)

(58) Field of Classification Search
CPC ............. H03K 17/00; H03K 17/04126; H03K 17/063; H03K 17/0826; H03K 17/601; H03K 17/6871; H03K 2217/00; H03K 2217/0036; H03K 3/00; H03K 3/84
USPC ........................................................ 327/109
See application file for complete search history.

(56) References Cited

U.S. PATENT DOCUMENTS

| | | | |
|---|---|---|---|
| 7,746,123 B2 | 6/2010 | Hester et al. | |
| 8,093,955 B2 | 1/2012 | Ying et al. | |
| 2009/0116134 A1* | 5/2009 | Howley | G11B 5/022 360/71 |
| 2010/0123511 A1* | 5/2010 | Strzalkowski | H03K 17/6871 327/530 |
| 2011/0205772 A1 | 8/2011 | Hunger | |
| 2012/0163042 A1 | 6/2012 | Zhou et al. | |
| 2012/0242379 A1* | 9/2012 | Obkircher | H03B 5/1228 327/117 |
| 2015/0373796 A1* | 12/2015 | Bahrehmand | H05B 33/0815 315/129 |
| 2016/0134272 A1* | 5/2016 | Wang | H03K 19/01852 327/109 |

FOREIGN PATENT DOCUMENTS

| | | |
|---|---|---|
| WO | 2011020436 A1 | 2/2011 |
| WO | 2012035474 A1 | 3/2012 |

OTHER PUBLICATIONS

"Linear feedback shift register," Wikipedia, http://en.wikipedia.org/wiki/Linear_feedback_shift_register, downloaded Feb. 17, 2015, 10 pgs.

* cited by examiner

*Primary Examiner* — Lincoln Donovan
*Assistant Examiner* — David Mattison
(74) *Attorney, Agent, or Firm* — Slater Matsil, LLP (57) ABSTRACT

In accordance with an embodiment, a method of driving a switching transistor includes receiving an activation signal for the switching transistor and generating a sequence of random values. Upon receipt of the activation signal, a control node of the switching transistor is driven with a drive strength based on a random value of the sequence of random values.

30 Claims, 5 Drawing Sheets

PRIOR ART

PRIOR ART

SYSTEM AND METHOD FOR A SWITCH TRANSISTOR DRIVER

TECHNICAL FIELD

The present disclosure relates generally to an electronic device, and more particularly to a system and method for a switch transistor driver.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS).

An SMPS usually includes at least one switch and an inductor or transformer. Some specific topologies include buck converters, boost converters, and flyback converters, among others. A control circuit is commonly used to open and close the switch to charge and discharge the inductor. In some applications, the current supplied to the load and/or the voltage supplied to the load is controlled via a feedback loop.

Generally, the efficiency of a SMPS improves as the speed of the switch increases because the switching losses decrease. Accordingly, SMPS have been utilizing more advanced power semiconductor components such as Super-Junction Metal Oxide Semiconductor Field Effect Transistors (MOSFETs) and Insulated Gate Bipolar Transistors (IGBTs) to increase the switching speed in SMPS. These advanced power semiconductor components have very low switching losses due to low internal parasitic capacitances and high switching speed. However, one of the side effects of high switching speeds is increased electromagnetic emissions, which presents challenges with respect to the designing a SMPS that is both power efficient and compliant with relevant electromagnetic interference (EMI) standards and requirements.

SUMMARY OF THE INVENTION

In accordance with an embodiment, a method of driving a switching transistor includes receiving an activation signal for the switching transistor and generating a sequence of random values. Upon receipt of the activation signal, a control node of the switching transistor is driven with a drive strength based on a random value of the sequence of random values.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switch-transistor driver. Embodiments of the present invention may also be applied to other circuits including, but not limited to switched-mode power supplies, motor control system, communication systems, as well as other circuits in potentially produce spurious emissions due to switching circuits.

In an embodiment of the present invention, a switch transistor driver is operated using a variable strength driver circuits whose drive strength is varied according to a random and/or pseudo random sequence. By varying the drive strength of the switch transistor driver, the steepness of the switching slopes are modulated from switching cycle to switching cycle, thereby attenuating sharp peaks in the frequency spectrum of electromagnetic emissions (EMI).

In various embodiments, modulating the strength of the driver circuit may be performed by a gate driver circuit independently of the gating signal provided by a control unit. This enables an improvement of EMI in existing applications by a "plug & play" replacement of the gate drivers without having to replace other system components. In other examples, embodiment systems and method may be combined with other known systems and methods of attenuating spurious emissions.

Figure 1:
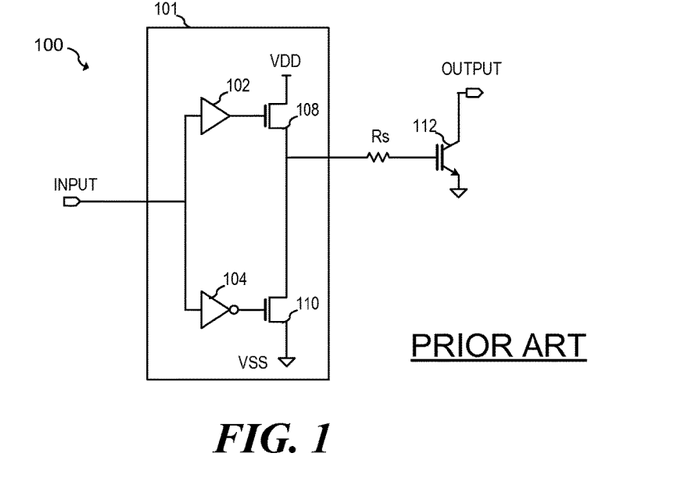
FIG. 1 illustrates a conventional switching transistor driving system.

FIG. 1 illustrates an exemplary switching transistor driver system 100 that includes gate driver circuit 101 that drives IGBT switching transistor 112. As shown, gate driver circuit 101 includes transistor 108 driven by buffer 102 and transistor 110 driven by inverting buffer 104. The output of gate driver circuit 101 is coupled to transistor 112 via series resistor Rs. During operation, an input signal is buffered by buffers 102 and 104 that drive the gates of transistors 108 and 110, respectively. As the signal at the INPUT node goes high, the output of buffer 102 also goes high which drives the gate of transistor 108. As transistor 108 turns on the gate of transistor 112 goes high and turns on transistor 112 via gate resistor Rs. When the signal at the INPUT node goes low, the output of buffer 102 goes low and turns off transistor 108, while the output of inverting buffer 104 goes high and turns on transistor 110. As transistor 110 turns on, the gate of transistor 112 discharges through resistor Rs and turns off transistor 112. During the switching on and switching off of transistor 112, steep transients caused by the periodic rapid charging and discharging of the device capacitances of transistor 112 may cause EMI.

In the past, EMI produced by switching has been addressed by modulating the switching frequency and/or duty cycle of the switching signal itself. By doing so, spurious power of the fundamental frequency and its sidebands are spread over a wider band of frequencies, thereby attenuating the peak magnitude of the spurious signals.

Figure 2A:
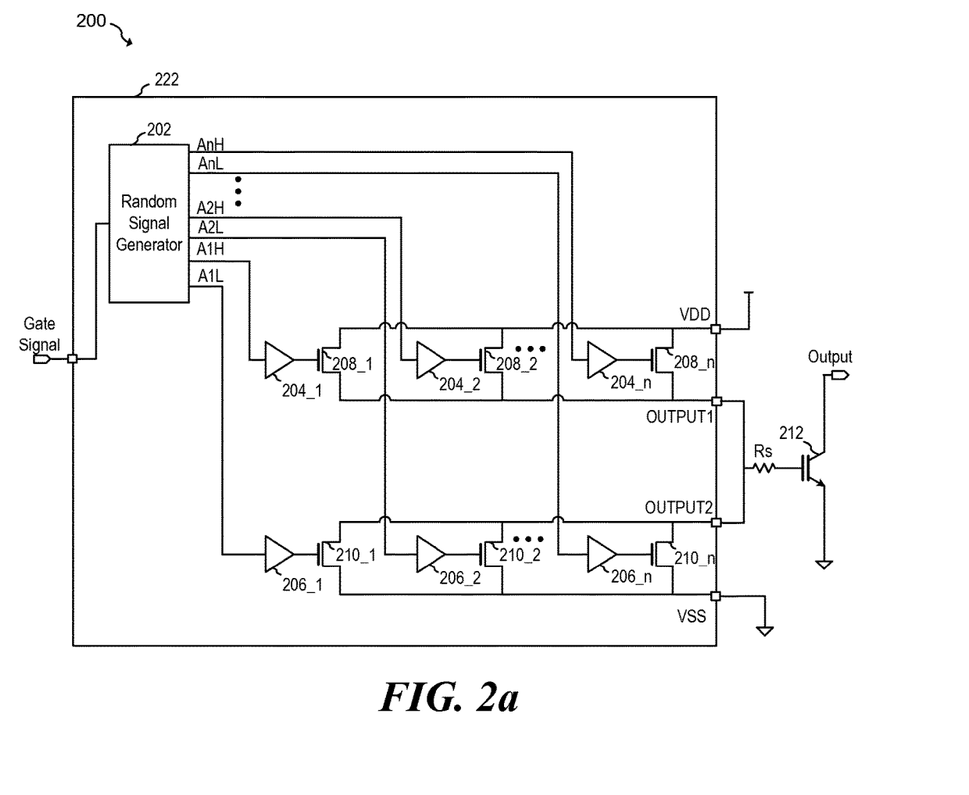
FIGS. 2a and 2b illustrate an embodiment switching transistor driving system in which the output impedance is varied.

In an embodiment of the present invention, spurious emissions are attenuated by randomly and/or pseudo-randomly adjusting the drive strength of a switching transistor driver system. FIG. 2a illustrates an embodiment switching transistor driver system 200 that adjusts its drive strength by adjusting the output impedance of the driver, for example, on a cycle-by-cycle basis. As shown, switching transistor driver system 200 includes random signal generator 202 that randomly activates one or more of n high-side transistors 208_1 to 208_n via corresponding buffers 204_1 to 204_n and n low-side transistors 210_1 to 210_n via corresponding buffers 206_1 to 206_n. In an embodiment, the n high-side transistors 208_1 to 208_n and n low-side transistors implemented using NMOS transistors. Alternatively, other transistor types may be used, for example, PMOS transistors, NPN bipolar transistors, and PNP bipolar transistors, or any combination thereof. It should be understood that embodiment control logic may be modified in order to drive the transistors of such alternative embodiments. For example, PMOS transistors may be used to implement high-side transistors, or a combination of PMOS and NMOS transistors working together may be used to implement high-side switches. In such an embodiment, the signal used to active a high-side PMOS transistor is inverted with respect to the signal used to activate a high-side NMOS device.

In an embodiment, the output impedance of switching transistor driver system 220 at output pins Output1 and Output 2 are inversely proportional to the number of high-side and low-side transistors selected. By modifying the selection of output transistors on a cycle-by-cycle basis, the variation at the output of switching transistor driver system 200 serves to attenuate spurious peaks in the frequency response. In an embodiment, switching transistor driver system 200 may include any number of randomly selected transistor output stages. In some embodiments, deselected transistor stages are fully deactivated by turning the corresponding transistors OFF. For example, when transistors 208_1 and 210_1 are not selected, both transistors are turned OFF.

As shown, each of high-side transistors 208_1 to 208_n, as well as low-side transistors 210_1 to 210_n are separately and independently addressable via high-side control signals A1H to AnH and low-side control signals A1L to AnL, respectively. In some embodiments, the various high-side and low-side transistors are randomly selected independent of each other. In other embodiments, transistor pairs are selected by random signal generator 202.

Switching transistor driver system 200 includes integrated circuit 222 on which the various driver elements are disposed and is coupled to IGBT switching transistor 212 via resistor Rs. Alternatively, other transistor types of semiconductor-based switches such as power MOSFETs and Bipolar transistors may be used to implement transistor 212. As shown, pins OUTPUT1 and OUTPUT2 are connected together external to integrated circuit 222. In alternative embodiments, other external connection configurations may be implemented such as has having one resistor at OUTPUT1 and another resistor at OUTPUT2.

Figure 2B:
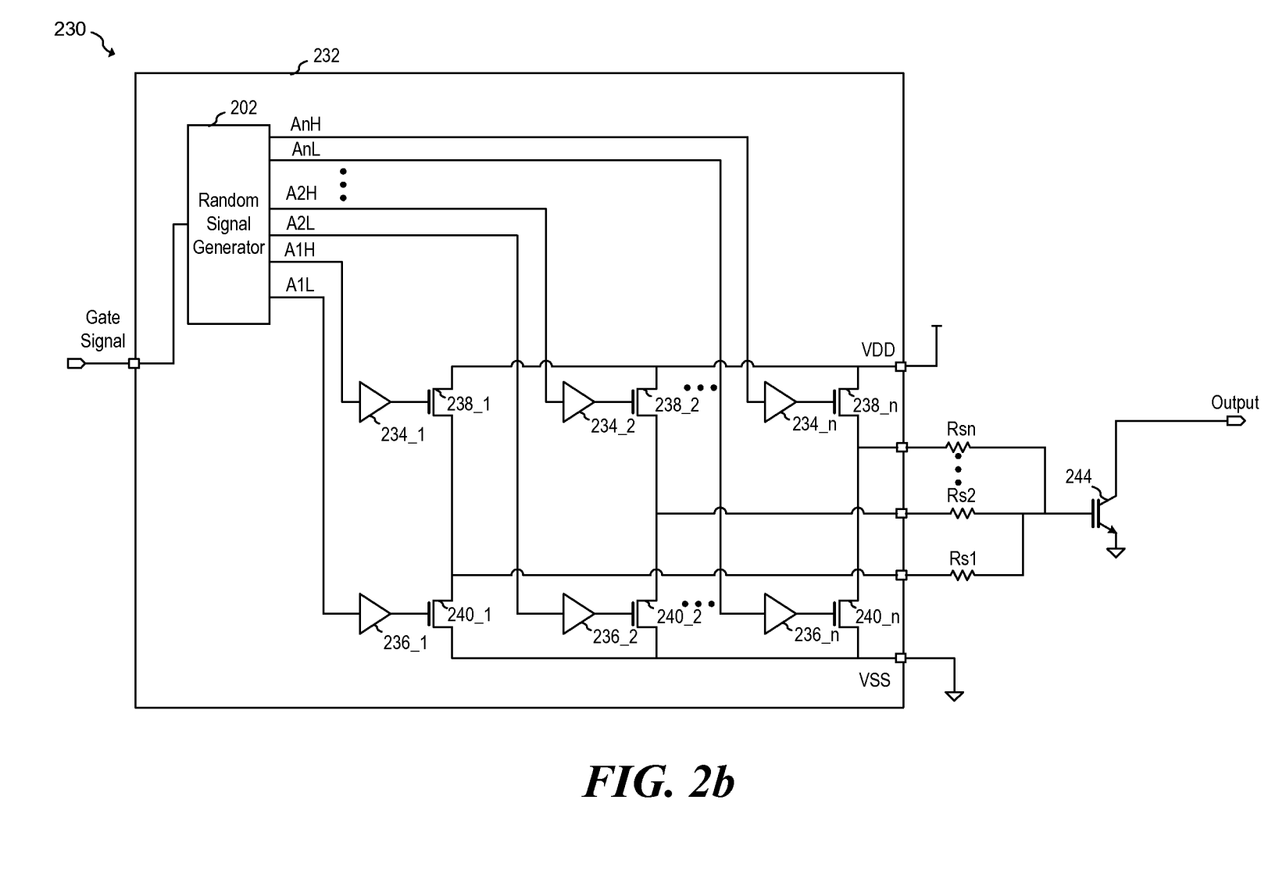

FIG. 2b illustrates switching transistor driver system 230 that includes integrated circuit 232 coupled to IGBT switching transistor 244 via resistors Rs1, Rs2 and Rs3. Integrated circuit 232 includes random signal generator 202 that is configured to drive high-side transistors 238_1 to 238_n via buffers 234_1 to 234_n and low-side transistors 240_1 to 240_n via inverting buffers 236_1 to 236_n. As shown, transistors 238_1 to 238_n and 240_1 to 240_n are arranged in pairs. For example, high-side transistor 238_1 is coupled to low-side transistor 240_1 to drive transistor 244 via resistor Rs1, high-side transistor 238_2 is coupled to low-side transistor 240_2 to drive transistor 244 via resistor Rs2, and high-side transistor 238_n is coupled to low-side transistor 240_n to drive transistor 244 via resistor RSn. It should be understood that n could be any number two or greater, and that integrated circuit 232 may be configured to support any number of switching transistors. As shown, each transistor of each pair of transistor may be independently controlled using separate high-side control signals A1H to AnH and low-side control signals A1L to AnL as described with respect to FIG. 2b.

In some embodiments, deselected transistor stages are fully deactivated by turning the corresponding transistors OFF. For example, when transistors 238_1 and 240_1 are not selected, both transistors are turned OFF via control signals A1H and A1L, thereby placing the respective transistor pair output in a high impedance state. In some embodiments, once a full switching cycle has been executed for the high-side and low-side transistors, the output of the random signal generators are set to a known state in order to keep the driven transistors in a safe fully on or off state. This known state may be activated at a fixed time after the gate signal stops transitioning and/or may be activated based on voltage feedback, current feedback, charge feedback or a combination thereof.

Figure 3A:
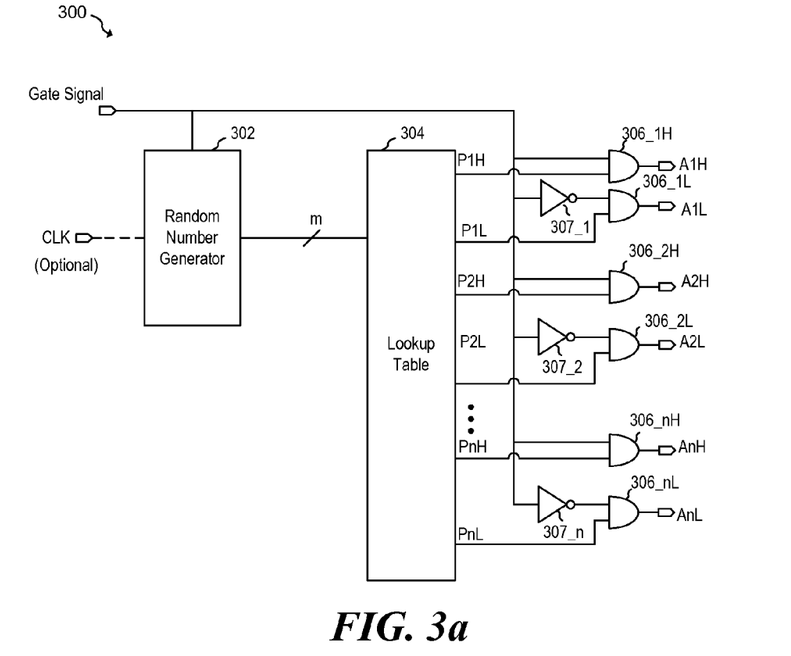
FIGS. 3a-3b illustrate schematics of an embodiment random signal generator for use in embodiment switching transistor driving systems.

FIG. 3a illustrates an embodiment random signal generator 300 that may be used to implement random signal generator 202 shown in FIGS. 2a and 2b described above. As shown, embodiment random signal generator 300 includes random number generator 302 that produces an m-bit random number. This m-bit random number is mapped to a set of high-side activation outputs P1H to PnH and low-side activation outputs P1L to PnL, which are used to determine which transistor output stages are activated when the input Gate Signal is activated. In some embodiments, Random Number Generator 302 produces a new random value at each transition of the Gate signal. In an alternative embodiment, a new random value is produced by random number generator 302 based on the state of optional clock signal CLK.

As shown, AND gates 306_1H to 306_nH produce selection signals A1H to AnH, and inverters 307_1 to 307_n along with AND gates 306_1L to 306_nL produce selection signals A1L to AnL that are used to select and activate the various transistor output stages shown in FIGS. 2a and 2b. It should be understood that the embodiment of FIG. 3a is just one example of many possible circuits that may be used to produce selection signals A1H to AnH and A1L to AnL. In alternative embodiments, other circuits that produce a similar function may be used. For example, lookup table 304 may be implemented using other forms of mapping logic. Similarly, the various logic gates shown in FIG. 3a may be implemented using other circuits and/or logic functions. For example, in some embodiments, a single inverter may be used in place of inverters 307_1 to 307_n.

Figure 3B:
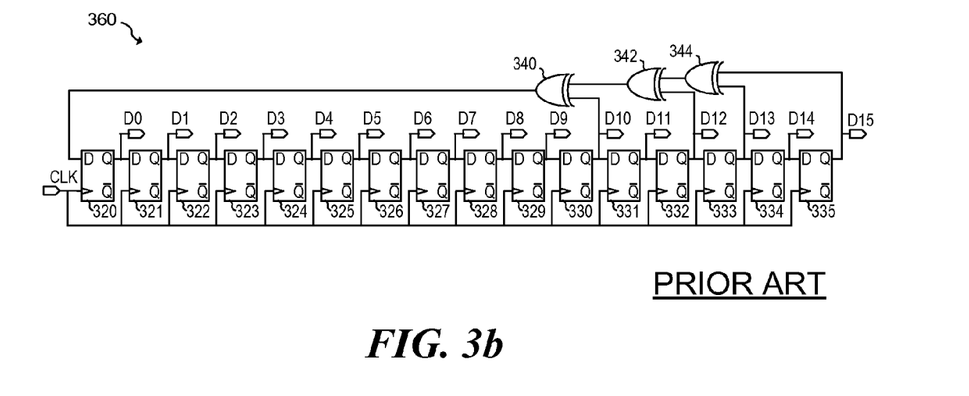

FIG. 3b illustrates and example linear feedback shift register 360 that may be used to implement random number generator 302 shown in FIG. 3a. As shown, linear feedback shift register 360 is in the form of a Fibonacci linear feedback shift register that includes a 16-bit shift register implemented using d-type flip-flops 320 to 335 having outputs D0 to D15. The outputs of registers 330, 332, 333 and 335 corresponding to outputs D10, D12, D13 and D15, respectively are fed back to first register 320 via exclusive-OR gates 340, 342 and 344. Accordingly, linear feedback shift register 360 implements the following polynomial:

$$x^{16}+x^{14}+x^{13}+x^{11}+1.$$

It should be appreciated that linear feedback shift register 360 illustrated in FIG. 3b is just one of many linear feedback shift register structures that may be used to implement embodiment random number generator 320. Other linear feedback structures may be used including, but not limited to Galois linear feedback shift registers. Moreover, embodiment linear feedback shift registers may be implemented using other bit lengths besides 16 bits and/or may be implemented using other polynomials as described above. In some embodiments, the clock signal CLK coupled to the various registers may be based on the state of the Gate Signal shown in FIG. 3a.

In further embodiment, other random number generator circuits may be used besides linear feedback shift register-based random number generators, including, but not limited to hardware generators based on physical sources of entropy (thermal noise, shot noise, avalanche noise, radioactive decay, etc.) and random number algorithms implemented in software and/or hardware.

Figure 4:
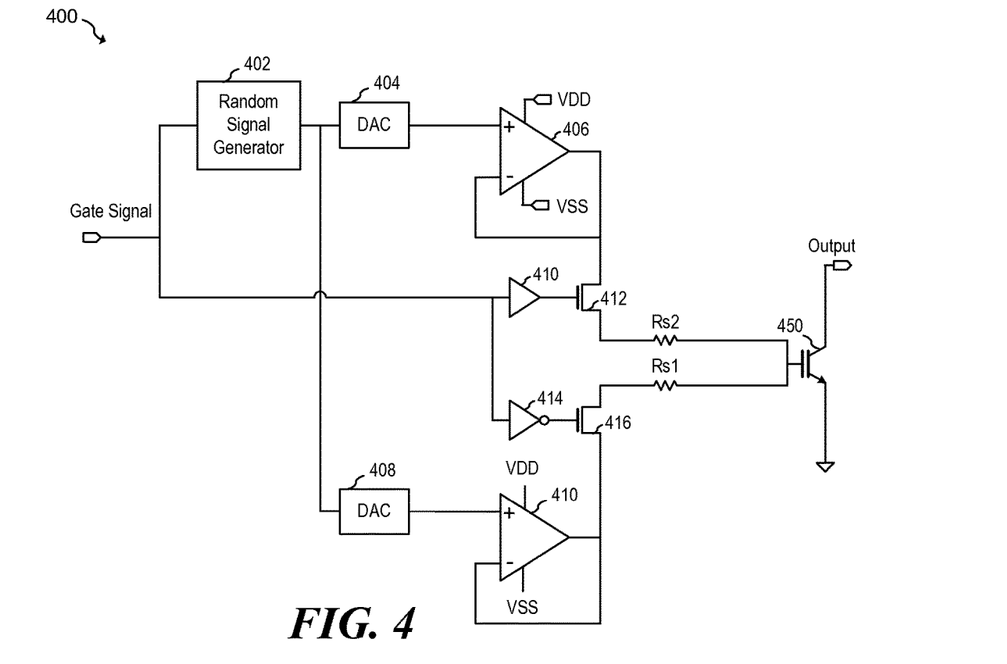
FIG. 4 illustrates an embodiment switching transistor driving system in which the output voltage is varied.

In accordance with a further embodiment, the strength of the drive signal may be varied by randomly adjusting the drive voltage applied to a drive transistor. As illustrated in FIG. 4, the supply voltage provided to high-side transistor 412 and to low-side transistor 416 is varied according to the output of random signal generator 402 in driver system 400. As shown, the output of high-side transistor 412 is coupled to IGBT switching transistor 450 via resistor Rs2 and the output of low-side transistor 416 is coupled to IGBT switching transistor 450 via resistor Rs1. In an embodiment, the output of random signal generator 402 is applied to the inputs of digital-to-analog converters (DACs) 404 and 408, whose output voltages are buffered by operational amplifier-based unity gain buffers 406 and 410, respectively. DACs 404 and 408 may be implemented using standard DAC circuits known in the art. Alternatively, other DAC circuits and/or other bit resolutions may be used according to the particular embodiment and its specifications. Buffers 406 and 410 may be implemented using various operational amplifier circuits known in the art. Alternatively, non-unity gain architectures and/or buffer circuits that do not utilize operational amplifiers may also be used. In some embodiments, once a full switching cycle has been executed for the high-side and low-side transistors, the output of the random signal generators are set to a known state in order to keep the driven transistors in a safe fully on or off state. This known state may be activated at a fixed time after the gate signal stops transitioning and/or may be activated based on voltage feedback, current feedback, charge feedback or a combination thereof.

Figure 5:
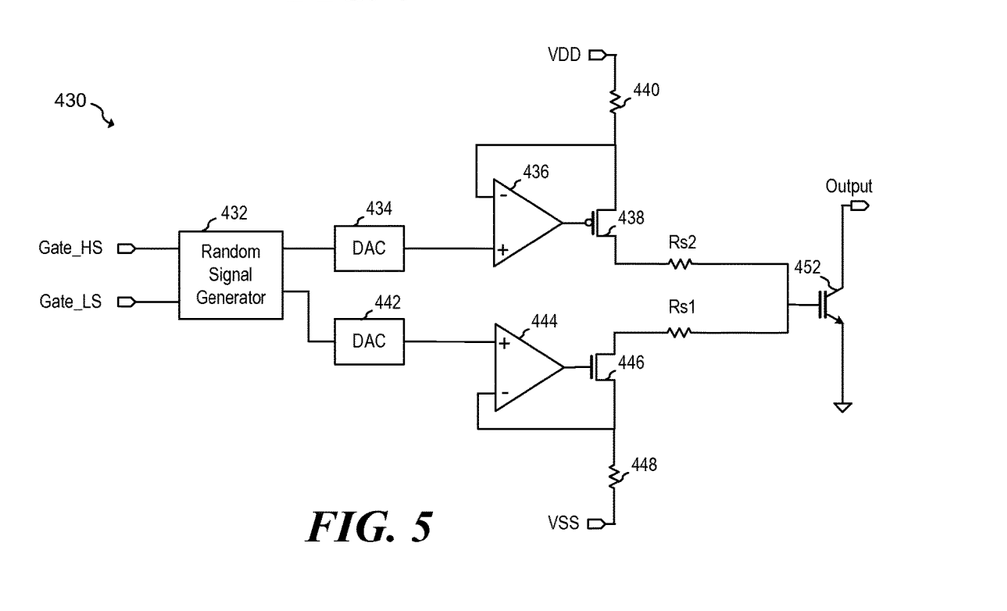
FIG. 5 illustrates an embodiment switching transistor driving system in which the output current is varied.

In a further embodiment, the strength of the drive signal may be varied by randomly adjusting the current drive applied to the gate of the switching transistors. As illustrated in FIG. 5, the current provided to high-side transistor 438 and to low-side transistor 446 is varied according to the output of random signal generator 432. As shown, the output of high-side transistor 438 is coupled to IGBT switching transistor 452 via resistor Rs2 and the output of low-side transistor 446 is coupled to IGBT switching transistor 452 via resistor Rs1. In an embodiment, the output of random signal generator 402 is applied to the input of digital-to-analog converter (DAC) 434, and whose output voltage is converted into a corresponding drive current using a feedback circuit that includes output transistor 438, resistor 440 and operational amplifier 436. In an embodiment, the output voltage of DAC 434 is applied to resistor 440 via operational amplifier 436 and high-side output transistor 438. The gain of operational amplifier 436 effectively forces the voltage of the negative input terminal of operational amplifier 436 to substantially match the voltage of the positive input terminal of operational amplifier 436. Thus, as the output voltage of DAC 434 is adjusted, the voltage across resistor 440 is adjusted, thereby changing the current flowing through transistor 438. Similarly, the a further output of random signal generator 432 is coupled to the input of DAC 442, which applies its output voltage to a feedback circuit that includes operational amplifier 444, low-side output transistor 446 and resistor 448.

During operation, high side gate signal Gate_HS causes random signal generator 432 to output a random value that is applied to DAC 434. The output of DAC 434 is then converted into a drive current using operational amplifier 436, output transistor 438 and resistor 440. Similarly, low side gate signal Gate_LS causes random signal generator 432 to output a random value that is applied to DAC 442. The output of DAC 442 is then converted into a drive current using operational amplifier 444, output transistor 446 and resistor 448. In alternative embodiments of the present invention, other circuits may be used. For example, in one embodiment, the drive current at outputs OUTPUT1 and OUTPUT2 are produced directly using a current DAC (IDAC). In some embodiments, once a full switching cycle has been executed for the high-side and low-side transistors, the output of the random signal generators are set to a known state in order to keep the driven transistors in a safe fully on or off state. This known state may be activated at a fixed time after the gate signal stops transitioning and/or may be activated based on voltage feedback, current feedback, charge feedback or a combination thereof.

Figure 6:
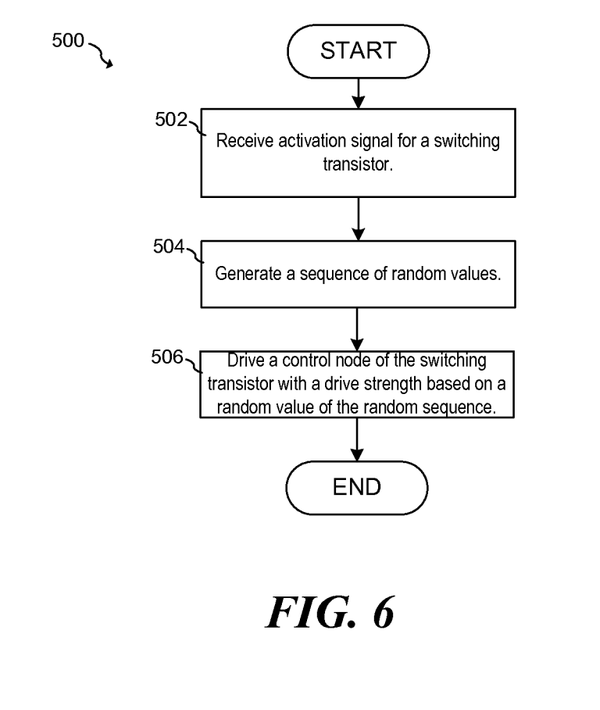
FIG. 6 illustrates a block diagram of an embodiment method.

FIG. 6 illustrates a block diagram 500 of an embodiment method of driving a switching transistor. In step 502, an activation signal is received for a switching transistor, and in step 504, a sequence of random values is generated. In some embodiments, each random value of the sequence of random values may be generated upon receipt of the activation signal or may be generated using an independent clock. Finally, in step 506, a control node of the switching transistor is driven using a drive strength that is based on a random value of the sequence of random values. As discussed with respect to embodiments herein, the drive strength may be varied, for example, by modifying the output impedance, drive voltage or drive current of the switching transistor driver.

Embodiment systems and methods may be combined with other known systems and methods of attenuating spurious emissions. For example, the phase, frequency and/or duty cycle of the gate signal used to trigger embodiment circuits and systems may be modulated using conventional systems and method for reducing spurious emissions. In one example, the frequency of the switching signal is modulated.

By further modifying the drive strength of the drive signal in a random fashion, as described above, spurious emissions may be further reduced.

In accordance with various embodiments, circuits or systems may be configured to perform particular operations or actions by virtue of having hardware, software, firmware, or a combination of them installed on the system that in operation causes or cause the system to perform the actions. One general aspect includes a method of driving a switching transistor that includes receiving an activation signal for the switching transistor and generating a sequence of random values. Upon receipt of the activation signal, a control node of the switching transistor is driven with a drive strength based on a random value of the sequence of random values. Other embodiments of this aspect include corresponding circuits and systems configured to perform the various actions of the methods.

Implementations may include one or more of the following features. The method where driving the control node of the switching transistor includes driving the control node of the switching transistor with a driver circuit; and the method further includes adjusting the driver circuit according to the random value of the sequence of random values. The method where adjusting the driver circuit includes adjusting an output impedance of the driver circuit. Driving the control node of the switching transistor with the drive strength based on the random value of the sequence of random values may be configured to attenuate peaks in a spectrum of electromagnetic interference (EMI).

In some embodiments, adjusting the output impedance of the driver circuit includes selectively activating a subset of a plurality of parallel output drivers, such that a number of output drivers in the subset is based on the random value of the sequence of random values. In a further embodiment, selectively activating a subset of a plurality parallel output drivers includes applying the random value to an input of a lookup table and determining the subset of the plurality of parallel output drivers based on an output of the lookup table. Adjusting the driver circuit may include adjusting an output voltage of the driver circuit according to the random value of the sequence of random values.

In an embodiment, driving the control node of the switching transistor includes applying the adjusted output voltage to the control node of the switching transistor via at least one resistor. Adjusting the output voltage may include applying the random value to an input of a digital-to-analog converter and coupling an output of the digital-to-analog converter to the control node of the switching transistor. In various embodiments, adjusting the driver circuit includes adjusting an output current of the driver circuit. In an embodiment, generating the sequence of random values includes using a linear feedback shift register. Implementations of the described techniques may include hardware, a method or process, or computer software on a computer-accessible medium.

Another general aspect includes a circuit having a random sequence circuit configured to produce a sequence of random values and an adjustable drive circuit having an output configured to be coupled to a control node of a switching transistor. The adjustable drive circuit is configured to produce a drive signal upon receipt of an activation signal, where the drive signal has a drive strength based on a random value of the sequence of random values. Other embodiments of this aspect include corresponding circuits and systems configured to perform the various actions of the methods.

Implementations may include one or more of the following features. The circuit further including the switching transistor coupled the output of the adjustable drive circuit. The circuit further including a resistor coupled between the output of the adjustable drive circuit and the control node of the switching transistor. The circuit where the random sequence circuit and the adjustable drive circuit are disposed on a semiconductor substrate. The circuit where the adjustable drive circuit has an output impedance based on the random value.

In some embodiments, the adjustable drive circuit has an output voltage based on the random value, while in other embodiments, the adjustable drive circuit has an output current based on the random value. In some embodiment, the random sequence circuit includes a plurality of activation outputs, and the random sequence circuit configured to determine a subset of the plurality of activation outputs based on the random value and activate the subset of the plurality of activation outputs. The random sequence circuit may include a linear feedback shift register.

The adjustable drive circuit may include a plurality of output drivers having corresponding input coupled to the plurality of activation outputs. In some embodiments, the plurality of output drivers is coupled in parallel. Each of the plurality of output drivers may include a high-side drive and a low-side driver, where an output of the high side driver is coupled to an output of the low-side driver. Implementations of the described techniques may include hardware, a method or process, or computer software on a computer-accessible medium.

A further general aspect includes an integrated circuit including a pseudo-random sequence generator, a plurality of output drivers configured to be coupled to an external switch transistor, and a logic circuit having inputs coupled to an output of the pseudo-random sequence generator and outputs coupled to the plurality of output drivers. The logic circuit is configured to activate a subset of the plurality of output drivers based on an output of the pseudo-random sequence generator upon receipt of an activation signal. Other embodiments of this aspect include corresponding circuits and systems configured to perform the various actions of the methods.

Implementations may include one or more of the following features. The integrated circuit where the plurality of output drivers are coupled in parallel. The integrated circuit where the each of the plurality of output drivers includes a high-side drive and a low-side driver, such that an output of the high side driver is coupled to an output of the low-side driver. In some embodiments, the pseudo-random sequence generator includes a linear feedback shift register followed by a lookup table. Implementations of the described techniques may include hardware, a method or process, or computer software on a computer-accessible medium.

Advantages of some embodiments include the ability to modulate the steepness of the switching slope from cycle to cycle in order to attenuate sharp peaks in the frequency spectrum of electromagnetic emissions without having to modulate the frequency and/or duty cycle of the switching signal. Moreover, circuitry used to modulate the frequency and/or duty cycle in order to reduce spurious emissions may be omitted in some embodiments in which the drive strength is modulated. In various embodiments, higher power efficiencies due to fast switching slopes may be maintained while, at the same time, limiting electromagnetic emissions.

A further advantage includes the ability to modulate the strength of the driver circuit independently of the gating signal provided by a control unit, thereby enabling EMI improvement via a "plug and play" replacement of gate drivers without having to replace other system components. Another advantage of some embodiments includes the ability to attenuate sharp peaks in the frequency spectrum without substantially affecting the switching frequency and duty cycle.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media that is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. In addition, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. In addition, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of intraoperative hardware units, including one or more processors as described above, in conjunction with suitable software and/or firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of driving a switching transistor, the method comprising:
   receiving an activation signal for the switching transistor;
   generating a sequence of random values; and
   upon receipt of the activation signal, driving a control node of the switching transistor with a drive strength based on a random value of the sequence of random values.

2. The method of claim 1, wherein:
   driving the control node of the switching transistor comprises driving the control node of the switching transistor with a driver circuit; and
   the method further comprises adjusting the driver circuit according to the random value of the sequence of random values.

3. The method of claim 2, wherein adjusting the driver circuit comprises adjusting an output impedance of the driver circuit.

4. The method of claim 3, wherein adjusting the output impedance of the driver circuit comprises selectively activating a subset of a plurality of parallel output drivers, wherein a number of output drivers in the subset is based on the random value of the sequence of random values.

5. The method of claim 4, wherein selectively activating a subset of a plurality parallel output drivers comprises applying the random value to an input of a lookup table and determining the subset of the plurality of parallel output drivers based on an output of the lookup table.

6. The method of claim 2, wherein adjusting the driver circuit comprises adjusting an output voltage of the driver circuit according to the random value of the sequence of random values.

7. The method according to claim 6, wherein driving the control node of the switching transistor comprises applying the adjusted output voltage to the control node of the switching transistor via at least one resistor.

8. A method of driving a switching transistor, the method comprising:
   receiving an activation signal for the switching transistor;
   generating a sequence of random values;
   adjusting a driver circuit according to a random value of the sequence of random values; and
   upon receipt of the activation signal, driving a control node of the switching transistor with a drive strength based on the random value of the sequence of random values, wherein driving the control node of the switching transistor comprises driving the control node of the switching transistor with the driver circuit, adjusting the driver circuit comprises adjusting an output voltage of the driver circuit according to the random value of the sequence of random values, and adjusting the output voltage comprises applying the random value to an input of a digital-to-analog converter and coupling an output of the digital-to-analog converter to the control node of the switching transistor.

9. The method of claim 2, wherein adjusting the driver circuit comprises adjusting an output current of the driver circuit.

10. The method of claim 1, wherein generating the sequence of random values comprises using a linear feedback shift register.

11. The method of claim 1, wherein driving the control node of the switching transistor with the drive strength based on the random value of the sequence of random values is configured to attenuate peaks in a spectrum of electromagnetic interference (EMI).

12. A circuit comprising:
a random sequence circuit configured to produce a sequence of random values; and
an adjustable drive circuit having an output configured to be coupled to a control node of a switching transistor, the adjustable drive circuit configured to produce a drive signal upon receipt of an activation signal, wherein the drive signal has a drive strength based on a random value of the sequence of random values.

13. The circuit of claim 12, further comprising the switching transistor coupled to the output of the adjustable drive circuit.

14. The circuit of claim 13, further comprising a resistor coupled between the output of the adjustable drive circuit and the control node of the switching transistor.

15. The circuit of claim 12, wherein the random sequence circuit and the adjustable drive circuit are disposed on a semiconductor substrate.

16. The circuit of claim 12, wherein the adjustable drive circuit has an output impedance based on the random value.

17. The circuit of claim 12, wherein the adjustable drive circuit has an output voltage based on the random value.

18. The circuit of claim 12, wherein the adjustable drive circuit has an output current based on the random value.

19. The circuit of claim 12, wherein
the random sequence circuit comprises a plurality of activation outputs; and
the random sequence circuit configured to determine a subset of the plurality of activation outputs based on the random value and activate the subset of the plurality of activation outputs.

20. The circuit of claim 19, wherein the adjustable drive circuit comprises a plurality of output drivers having corresponding input coupled to the plurality of activation outputs.

21. The circuit of claim 20, wherein the plurality of output drivers are coupled in parallel.

22. The circuit of claim 20, wherein each of the plurality of output drivers comprises a high-side drive and a low-side driver, wherein an output of the high side driver is coupled to an output of the low-side driver.

23. The circuit of claim 12, wherein the random sequence circuit comprises a linear feedback shift register.

24. An integrated circuit comprising:
a pseudo-random sequence generator;
a plurality of output drivers configured to be coupled to an external switch transistor; and
a logic circuit having inputs coupled to an output of the pseudo-random sequence generator and outputs coupled to the plurality of output drivers, the logic circuit configured to activate a subset of the plurality of output drivers based on an output of the pseudo-random sequence generator upon receipt of an activation signal to modulate a steepness of a switching slope at a control node of the external switch transistor on a cycle by cycle basis.

25. The integrated circuit of claim 24, wherein the plurality of output drivers are coupled in parallel.

26. The integrated circuit of claim 24, wherein the each of the plurality of output drivers comprises a high-side drive and a low-side driver, wherein an output of the high side driver is coupled to an output of the low-side driver.

27. The integrated circuit of claim 24, wherein the pseudo-random sequence generator comprises a linear feedback shift register followed by a lookup table.

28. The method of claim 1, further comprising upon receipt of the activation signal varying a slew rate of the control node of the switching transistor on a cycle by cycle basis.

29. The circuit of claim 12, wherein the drive strength of the drive signal changes on a cycle by cycle basis.

30. The method of claim 2, wherein adjusting the driver circuit comprises adjusting a supply voltage of the driver circuit.

* * * * *